United States Patent [19]

Raynham et al.

[11] Patent Number: 5,774,647
[45] Date of Patent: Jun. 30, 1998

[54] MANAGEMENT OF MEMORY MODULES

[75] Inventors: Michael B. Raynham, Los Gatos; Myron R. Tuttle, Santa Clara; Andy Kim Sang Yu, Saratoga; Brian E. Donne, Gilroy; James K. Gendreau, Fremont, all of Calif.

[73] Assignee: Hewlett-Packard Company, Palo Alto, Calif.

[21] Appl. No.: 649,752

[22] Filed: May 15, 1996

[51] Int. Cl.[6] .................................................. G06F 11/00
[52] U.S. Cl. ................................. 395/185.01; 371/21.6; 711/115
[58] Field of Search ...................... 395/185.01, 185.04, 395/185.1; 371/21.6, 37.7; 711/115

[56] References Cited

U.S. PATENT DOCUMENTS

| | | | |
|---|---|---|---|
| 4,209,846 | 6/1980 | Seppa | 364/900 |
| 4,255,808 | 3/1981 | Schaber | 371/21.6 |
| 4,438,494 | 3/1984 | Budde et al. | 364/200 |
| 4,498,146 | 2/1985 | Martinez | 711/115 |
| 4,506,362 | 3/1985 | Morley | 371/21.6 |
| 4,679,195 | 7/1987 | Dewey | 395/185.01 |
| 4,932,028 | 6/1990 | Katircioglu et al. | 395/185.1 |
| 4,964,130 | 10/1990 | Bowden, III et al. | 371/21.6 |
| 4,969,085 | 11/1990 | Desjourdy | 364/200 |
| 5,018,143 | 5/1991 | Platteter et al. | 395/185.01 |
| 5,027,357 | 6/1991 | Yu et al. | 371/37.7 |
| 5,245,615 | 9/1993 | Treu | 395/183.21 |
| 5,410,545 | 4/1995 | Porter et al. | 371/21.6 |
| 5,610,929 | 3/1997 | Yamamoto | 371/377 |
| 5,615,335 | 3/1997 | Onffroy et al. | 395/183.06 |
| 5,644,707 | 7/1997 | Chen | 395/185.1 |
| 5,673,383 | 9/1997 | Sukegawa | 395/182.06 |

FOREIGN PATENT DOCUMENTS

| | | | |
|---|---|---|---|
| 0 494 547 A2 | 12/1991 | European Pat. Off. | 395/185.01 |
| 0 664 511 A2 | 7/1995 | European Pat. Off. | 395/185.01 |

OTHER PUBLICATIONS

The Preliminary Specification for "8 Byte Unbuffered DIMM Product Overview" Industry Standard, SA14–4619–00 Revised Oct. 1995 from IBM Corporation, pp. 1,5,7,8,10–13,42.

A proposed Subset of JEDEC Standard No 21–C 64/732/80 DIMM), Aug. 7, 1995, pp. 1–11.

*Primary Examiner*—Robert W. Beausoliel, Jr.
*Assistant Examiner*—Scott T. Baderman

[57] ABSTRACT

A memory module within a computing system includes a management memory. The management memory provides permanent storage for management information. For example, an error log is stored within the management memory. The error log indicates a time stamp for errors which occur in operation of the memory module. The error log consists of, for example, two lists. A first list indicates a time stamp for each (soft) correctable error which occurs in operation of the memory module. A second list indicates a time stamp for each (hard) non-correctable error which occurs in operation of the memory module.

19 Claims, 4 Drawing Sheets

MANAGEMENT OF MEMORY MODULES

BACKGROUND

The present invention concerns the management of memory modules within a computing system.

Computing systems generally use various types of technology to store data. For long term storage of data, disk drives are typically used. Disk drives provide for the permanent storage of large amounts of data. However, the access of data from disk drives is relatively slow as compared to other technologies. Memory that is accessed by a processor during runtime is generally stored in some form of random access memory (RAM) or read-only memory (ROM). RAM provides for relatively fast access of data. However, generally RAM is not utilized for the permanent storage of data because of the high relative cost and because of the volatility of many types of RAM. That is, when power is removed from many types of RAM, data stored in the RAM is lost.

In many computing system, random access memory (RAM) capacity is added using memory modules. For example, computer mother boards often have slots which will receive single in line memory modules (SIMMs) or dual in line memory modules (DIMMs). DIMMs typically have double the data width of a SIMM.

As there is an increase in the amount of data stored increases, so does the potential value of a DIMM. This raises the importance of accurately tracking the use of DIMMs, for example for the purpose of properly determining warranties, detecting counterfeits and so on. Currently, such tracking is not performed or is done rather primitively, for example, by stamping a serial number on the module. It is desirable, therefore, to provide more comprehensive management of memory modules.

BRIEF SUMMARY OF THE INVENTION

In accordance with the preferred embodiment of the present invention, a system is presented for managing a memory module within a computing system. Within the memory module, a management memory is provided. The management memory provides permanent storage for management information. For example, an error log is stored within the management memory. The error log indicates a time stamp for errors which occur in operation of the memory module. The error log consists of, for example, two lists. A first list indicates a time stamp for each (soft) correctable error which occurs in operation of the memory module. A second list indicates a time stamp for each (hard) non-correctable error which occurs in operation of the memory module.

When the first list is full, the first list wraps by overwriting entries in the first list when new correctable errors occur in operation of the memory module. Likewise, when the second list is full, the second list wraps by overwriting entries in the second list when new un-correctable errors occur in operation of the memory module. A first wrap count which indicates a number of times the first list wraps around and a second wrap count which indicates a number of times the second list wraps around are stored in the management memory. When the first wrap count or the second wrap count reaches a maximum value, the pertinent wrap count is frozen at the maximum value.

In the preferred embodiment of the present invention, other historical information about the memory module is stored in the management memory. For example, a time stamp is stored which indicates when the memory module was first placed in service. Also, in the preferred embodiment, a cyclic redundancy checksum is stored in the management memory as a security check for information stored in the management memory. For additional security, the cyclic redundancy checksum is calculated using a string of bytes within a program area of a microprocessor which accesses the management memory.

In the preferred embodiment of the present invention, the management memory is used within a management system within a computing system. The management system manages the memory modules within the computing system. The management system also includes indicating lights and a management controller. The management controller accesses the management information within the management memory and causes the indicating lights to indicate information about the memory modules. For example, each memory module slot has an associated indicating light. When the indicating light is off, this indicates there is no memory module within the memory module slot. When the indicating light flashes at a first rate, this indicates that the memory module within the memory module slot is not operating properly within the computing system. When the indicating light blinks at a second rate, this indicates that the memory module within the memory module slot is not from a particular entity. When the indicating light is on steadily, this indicates that the memory module within the memory module slot is from the particular entity. In the preferred embodiment of the present invention, the indicating lights are additionally used to indicate status of a central processing unit for the computing system.

The present invention provides an efficient way to manage memory modules within a computing system.

DETAILED DESCRIPTION OF THE PREFERRED EMBODIMENT

Figure 1:
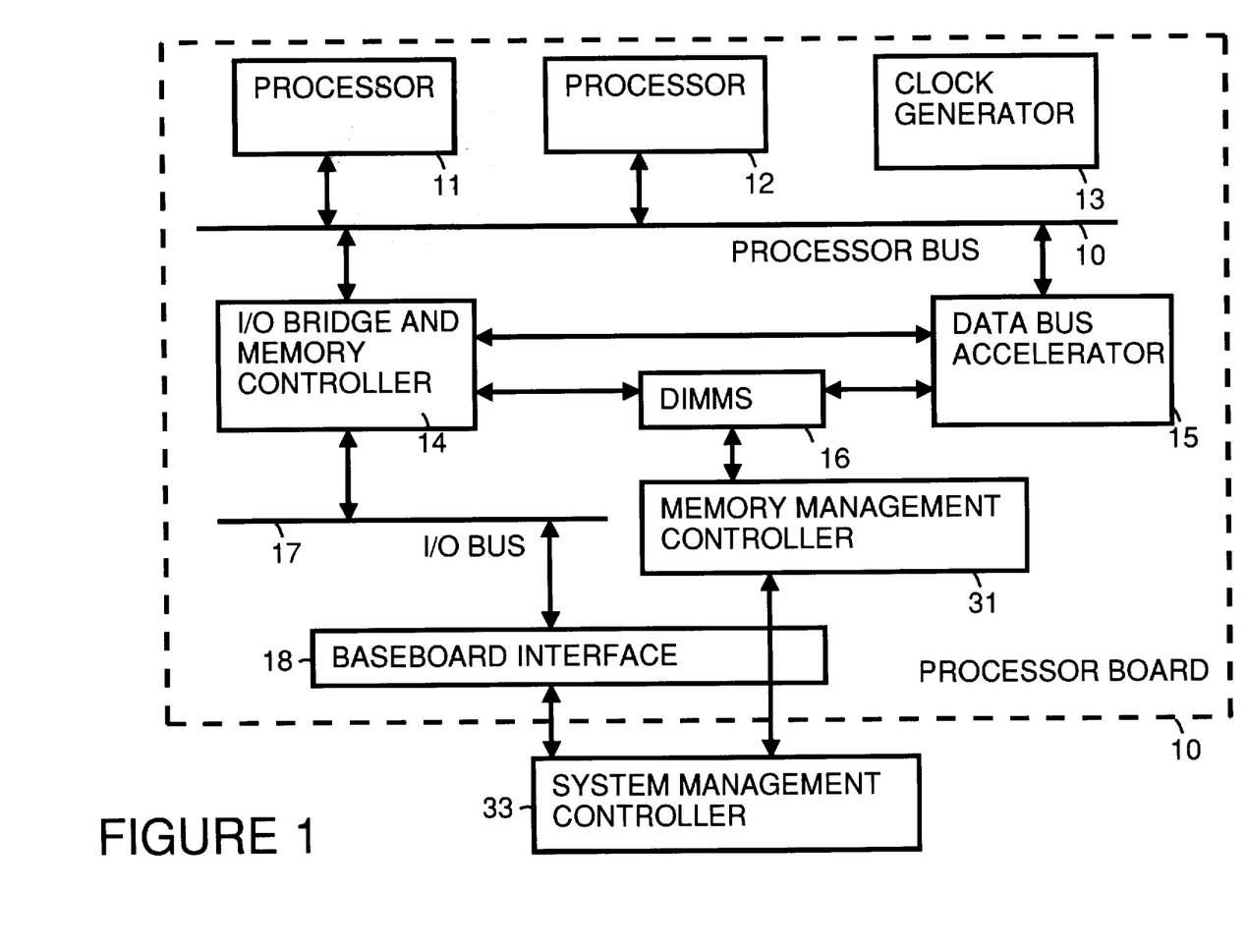
FIG. 1 is a simplified block diagram of a processor board which includes DIMMs which are implemented, for example, using dynamic random access memory (DRAM) in accordance with a preferred embodiment of the present invention.

FIG. 1 is a simplified block diagram of a processor board 10 used in a computing system which functions, for example, as a network server.

A processor 11 and a processor 12 are connected to a processor bus 10. For example, processor 11 and processor 12 are Pentium Pro processors available from Intel Corporation, having a business address of 2200 Mission College Boulevard, Santa Clara, Calif. Processor bus 10 is, for example, a P6 processor bus. A clock generator 13 generates clock signals for entities on processor board 10.

Also connected to processor bus 10 is an input/output (I/O) bridge and memory controller 14. I/O bridge and memory controller 14 serves as a bridge between processor bus 10 and an I/O bus 17. I/O bus 17 is for example, a Peripheral Component Interconnect (PCI) bus. I/O bridge and memory controller 14 also controls accesses to DIMMs 16. DIMMs 16 are composed of, for example, dynamic random access memory (DRAM). A data bus accelerator 15 accelerates access to DIMMs 16 from processor bus 10. A baseboard interface 18 provides connectivity between processor board 10 and other entities in the computing system. A memory management controller 31 and a system management controller 33 are part of a management system further described below.

Figure 2:
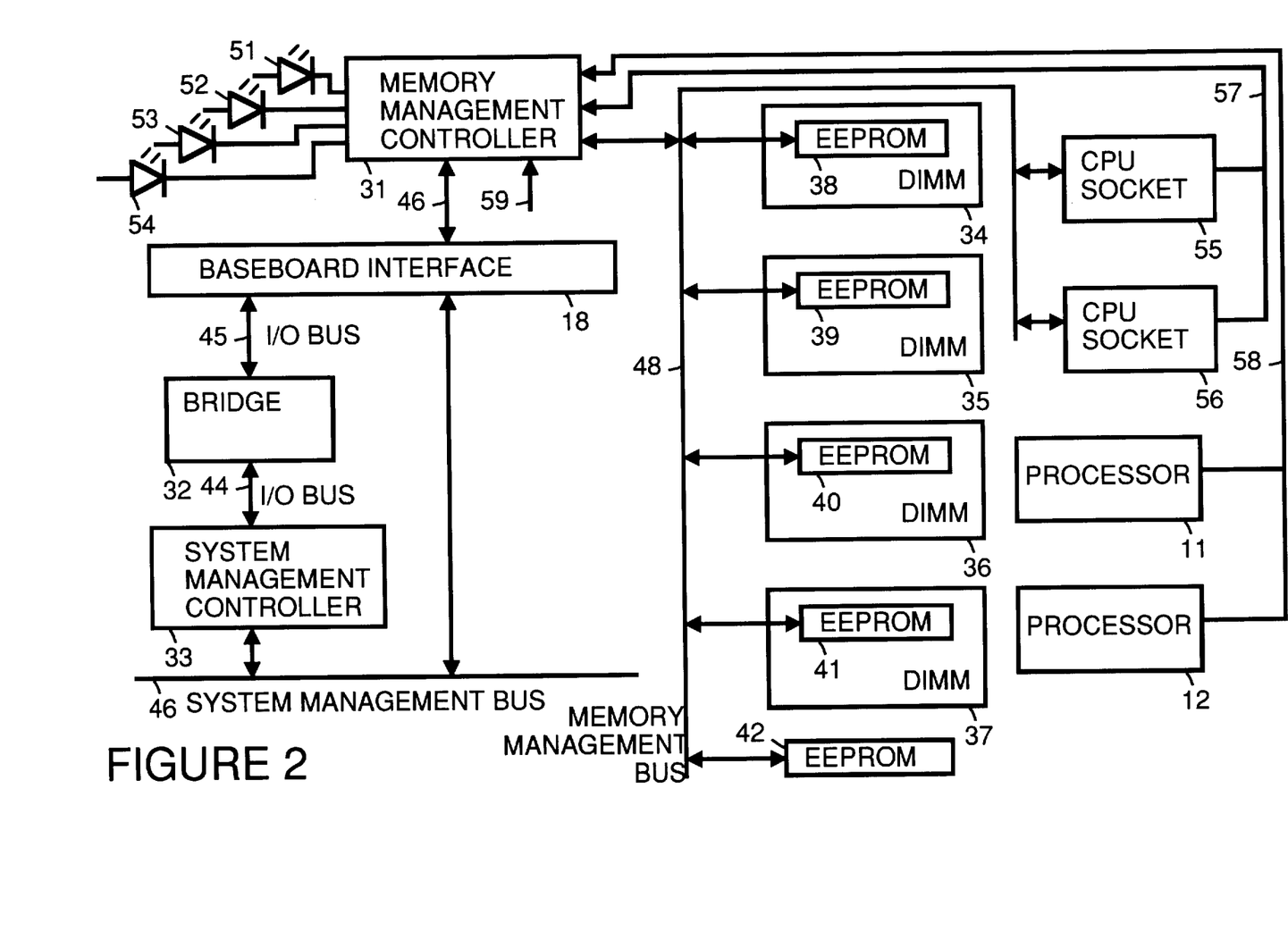
FIG. 2 is a simplified block diagram showing a management system for the processor board shown in FIG. 1 in accordance with a preferred embodiment of the present invention.

FIG. 2 is a simplified block diagram showing the management system for processor board 10 shown in FIG. 1. DIMMs 16, shown in FIG. 1, are represented in FIG. 2 as a DIMM 34, a DIMM 35, a DIMM 36 and a DIMM 37. Each of DIMMs 34 through 37 include a non-volatile management memory. For example, DIMM 34 includes an electrically erasable programmable read-only memory (EEPROM) 38, DIMM 35 includes an EEPROM 39, DIMM 36 includes an EEPROM 40 and DIMM 37 includes an EEPROM 41. Within each EEPROM is stored management information about the DIMM, as is further described below. Processor board 10 also has non-volatile memory, for example EEPROM 42, in which is stored management information about processor board 10. EEPROMs 38 through 42 are accessed via a memory management bus 48. Memory management bus 48 is, for example, a two-wire secondary I²C bus. Memory management controller 31 controls memory management bus 48. Memory management controller 31 is, for example, an 8xC751 I²C controller available from Philips Semiconductors, having a business address of 811 E. Arques Avenue, Sunnyvale, Calif. Memory management controller 31 includes output ports on which is connected a light emitting diode (LED) indicator 51, an LED indicator 52, an LED indicator 53 and an LED indicator 54. Also status input ports of management controller provide access of management controller for the purpose of determining status.

When no CPU error condition exists, LED indicator 51 through 54 indicate the status of DIMMs 34 through 37 respectively. When an LED indicator is off, this indicates that no DIMM is installed in the associated DIMM slot or that the installed DIMM has no EEPROM. When an LED indicator flashes at 1 hertz (Hz) 50% off and 50% on, this indicates that there is an uncorrectable error or an inappropriate DIMM in the associated DIMM slot. For inappropriate DIMMs, main processor 11 or 12 compares management information at power-up with the DIMM parameters supported by the system and tells memory management controller 31 to flash the appropriate LED if the DIMM is not supported. The parameters checked for support at start-up include, for example, memory type, data width of memory, RAS access time, CAS access time, interface levels, and so on. When an LED indicator blinks at 1 hertz (Hz) 90% on and 10% off, this indicates that there is a DIMM in the associated DIMM slot which is not from Hewlett-Packard Company. When an LED indicator is on, this indicates that there is a DIMM in the associated DIMM slot which is from Hewlett-Packard Company.

Figure 4:
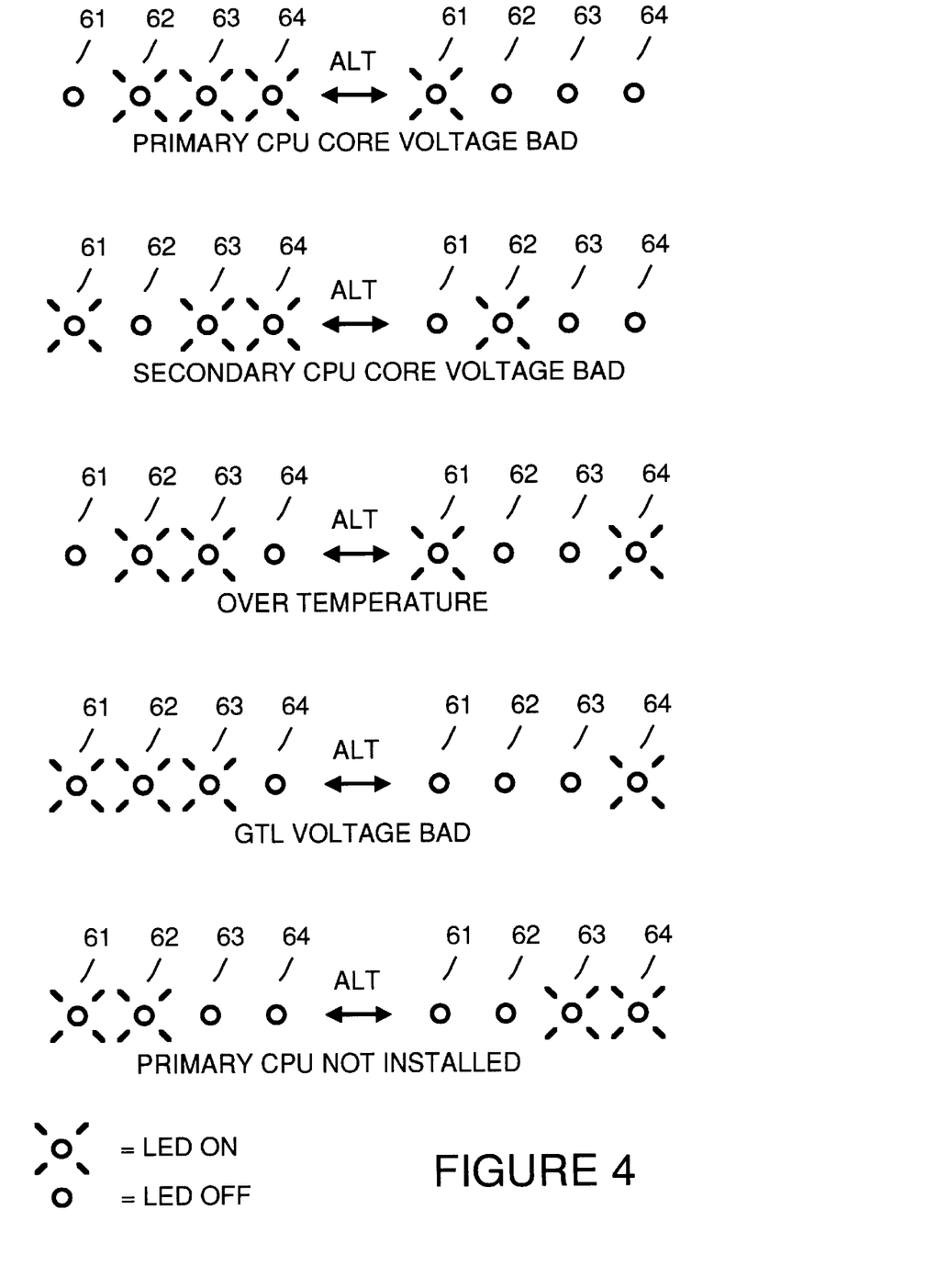
FIG. 4 shows status patterns displayed by LED indicators for CPU errors in accordance with a preferred embodiment of the present invention.

When a CPU error condition exists, LED indicator 51 through 54 alternate between the patterns shown in FIG. 4 at a rate of 1 Hz rate. The CPU patterns shown in FIG. 4 indicate the following five error conditions: (1) the primary CPU core voltage is bad; (2) the secondary CPU core voltage is bad; (3) over temperature; (4) the GTL voltage is bad; and, (5) the primary CPU is not installed.

Memory management controller 31 detects the third error conditions (over temperature) by an interrupt from CPU socket 55 or CPU socket 56 onto an interrupt line 57, shown in FIG. 2, or by an interrupt from processor 11 or processor 12 onto an interrupt line 58, shown in FIG. 2. Memory management controller 31 detects the first and second error conditions (CPU core voltage is bad), the fourth error condition (GTL voltage is bad) and the fifth error condition (primary CPU not installed) by inputs on other I/O ports 59, shown in FIG. 2.

Memory management controller 31 is connected to baseboard interface 18 through a system management bus 46. System management bus 46 is, for example, a two-wire I²C NetServer system management bus available from Hewlett-Packard Company, having a business address of 3000 Hanover Street, Palo Alto, Calif. Baseboard interface 18 connects system management bus 46 through to entities off processor board 10. System management controller 33 controls system management bus 46. Management controller 33 is, for example, a PCF 8584 I²C controller available from Philips Semiconductors.

System management controller 33 interfaces to the system central processing unit (i.e., processor 11 and processor 12), through the I/O bus system of the computing system. For example, system management controller 33 is connected to a bridge 32 through an I/O bus 44. For example, I/O bus 44 is a baseboard Industry Standard Architecture (ISA) bus. Bridge 32 is a PCI/Extended Industry Standard Architecture (EISA) bus bridge. Bridge 32 is connected to baseboard interface 18 through an I/O bus 45. I/O bus 45 is, for example, a PCI bus. Baseboard interface 18 connects I/O bus 45 to I/O bus 17, shown in FIG. 1.

In the preferred embodiment of the present invention, EEPROMs 38 through 41 each have a storage capacity of 256 bytes. In each of EEPROMs 38 through 41, 128 bytes of storage is reserved as an industry standard data area. See for example, The Preliminary Specification for "8 Byte Unbuffered Product Overview" Industry Standard, SA14-4619-00 Revised 10/95 available from IBM Corporation. See also the JEDEC Standard No 21-C. Table 1 below sets out the currently proposed use of the 128 bytes reserved as an industry standard data area.

TABLE 1

Industry standard data area of EEPROMs

| Byte | Addr | Contents | Values | Initial |
|---|---|---|---|---|
| 0 | 00h | Size of manufacturing data area (bytes) | unsigned byte | 128* |
| 1 | 01h | Total size of device (bytes) | unsigned byte | 256* |
| 2 | 02h | Memory Type (FPM, EDO, SDRAM) | unsigned byte | * |

TABLE 1-continued

Industry standard data area of EEPROMs

| Byte | Addr | Contents | Values | Initial |
|---|---|---|---|---|
| 3 | 03h | Number of row addresses on DIMM | unsigned byte | * |
| 4 | 04h | Number of column addresses on DIMM | unsigned byte | * |
| 5 | 05h | Number of banks on DIMM | unsigned byte | * |
| 6 | 06h | Data width of DIMM | unsigned word | * |
| 7 | 07h | | | * |
| 8 | 08h | Interface level (TTL, LVTTL, SSTL3.3) | unsigned byte | * |
| 9 | 09h | RAS access time of DIMM | unsigned byte | * |
| 10 | 0Ah | CAS access time of DIMM | unsigned byte | * |
| 11 | 0Bh | Error detection/correction (i.e. None, Parity, ECC, etc.) | unsigned byte | * |
| 12 | 0Ch | Refresh type and rate | unsigned byte | * |
| 13 | 0Dh | | | * |
| ... | | Reserved for future offerings | TBD | * |
| 31 | 1Fh | | | * |
| 32 | 20h | | | * |
| ... | | Superset information for future offerings | TBD | * |
| 63 | 3Fh | | | * |
| 64 | 40h | | | * |
| ... | | Manufacturer's JEDEC ID Code | per EIA/JEP106-E | * |
| 71 | 47h | | | * |
| 72 | 48h | Manufacturing location | Supplier Unique | * |
| 73 | 49h | Manufacturer's Part Number | Supplier Unique | * |
| ... | | | Left Justified, blank filled | * |
| ... | | | ASCII (6 bit packed?) | * |
| 90 | 5Ah | | | * |
| 91 | 5Bh | Manufacturer's Revision Code | Supplier Unique (ASCII?) | * |
| 92 | 5Ch | Manufacturing Date | week (binary) | * |
| 93 | 5Dh | | year (binary) | * |
| 94 | 5Eh | | | * |
| ... | | Assembly Serial # | 4 byte unsigned binary | * |
| 97 | 61h | | | * |
| 98 | 62h | | | * |
| ... | | Manufacturer Specific Data Area | | * |
| 127 | 7Fh | | | * |

The remaining 128 bytes of EEPROMs 38 through 41 are used to implement various features in accordance with preferred embodiments of the present invention. Table 2 below sets out the use of the 128 bytes in accordance with a preferred embodiment of the present invention.

TABLE 2

Remaining 128 bytes of EEPROMs

| Byte | Addr | Contents | Values | Initial |
|---|---|---|---|---|
| 0 | 80h | Fixed Table Revision Letter | 'A'–'Z' ASCII | 'A'** |
| 1 | 81h | Company Name | 'H' | 'H'** |
| 2 | 82h | | 'P' | 'P'** |
| 3 | 83h | Product or Accessory Number | LnnnL (i.e. D3064A) | ** |
| 4 | 84h | | Lnnnnnnnn (i.e. 5 × 5) | ** |
| 5 | 85h | | | ** |
| 6 | 86h | | | ** |
| 7 | 87h | | Left justified, blank filled | ** |
| 8 | 88h | | ASCII | ** |
| 9 | 89h | | If none then all blank | ** |
| 10 | 8Ah | | | ** |
| 11 | 8Bh | | | ** |
| 12 | 8Ch | | | ** |
| 13 | 8Dh | Part Number (4×4) | BCD packed two digits per byte. | ** |
| 14 | 8Eh | | | ** |
| 15 | 8Fh | | | ** |
| 16 | 90h | | | ** |
| 17 | 91h | Using Division | LLLL | ** |
| 14 | 92h | | Left justified, blank filled | ** |

TABLE 2-continued

Remaining 128 bytes of EEPROMs

| Byte | Addr | Contents | Values | Initial |
|---|---|---|---|---|
| 19 | 93h | | ASCII | ** |
| 20 | 94h | | If none then all blank | ** |
| 21 | 95h | Optional Table Revision Letter | 'A'–'Z' ASCII | 'A'*** |
| 22 | 96h | Offset of next Correctable log entry | unsigned byte | 0*** |
| 23 | 97h | Offset of Correctable error table | unsigned byte | B6h*** |
| 24 | 98h | Count of Correctable error wraps | unsigned byte | 0*** |
| 25 | 99h | Offset of next Un-Correctable log entry | unsigned byte | 0*** |
| 26 | 9Ah | Offset of Un-Correctable error table | unsigned byte | F6h*** |
| 27 | 9Bh | Count of Un-Correctable error wraps | unsigned byte | 0*** |
| 28 | 9Ch | | unsigned byte | 0*** |
| 29 | 9Dh | Count of Writes to EEPROM | unsigned byte | 0*** |
| 30 | 9Eh | | unsigned byte | 0*** |
| 31 | 9Fh | Manufacturing entity - Upper Level | LLLL | 20h***** |
| 32 | A0h | | Left justified, blank filled | 20h***** |
| 33 | A1h | | ASCII | 20h***** |
| 34 | A2h | | | 20h***** |
| 35 | A3h | Host product part number | LnnnnL | 20h**** |
| 36 | A4h | No 4×4 or 5×5 will appear here | | 20h**** |
| 37 | A5h | | Left justified, blank filled | 20h**** |
| 38 | A6h | | ASCII | 20h**** |
| 39 | A7h | | If none then all blank | 20h**** |
| 40 | A8h | | | 20h**** |
| 41 | A9h | Mem Board #(3bit)/DIMM #(5 bit) | unsigned byte | 0**** |
| 42 | AAh | Turn on time stamp | 2 byte time stamp | 0**** |
| 43 | ABh | | | 0**** |
| 44 | ACh | Manufacturing Data: | BCD 2 digits per byte | ***** |
| 45 | ADh | Serial Number | | ***** |
| 46 | AEh | 8 digits only | | ***** |
| 47 | AFh | | | ***** |
| 48 | B0h | Manufacturing Data: Burn in count | unsigned byte | ***** |
| 49 | B1h | Manufacturing Data: Shift | unsigned byte | ***** |
| 50 | B2h | Manufacturing Data: | BCD, 2 digits per byte | ***** |
| 51 | B3h | Last Fail Code | | ***** |
| 52 | B4h | Manufacturing Data: | 2 byte time stamp | ***** |
| 53 | B5h | Time Stamp | | ***** |
| 54 | B6h | Correctable error log table | 2 byte time stamp | 0*** |
| ... | | 32 entries | | 0*** |
| 117 | F5h | | | 0*** |
| 118 | F6h | Un-Correctable log table | 2 byte time stamp | 0*** |
| ... | | 4 entries | | 0*** |
| 125 | FDh | | | 0*** |
| 126 | FEh | Security CRC of bytes 0–125 and "magic string" | 2 unsigned bytes | *** |
| 127 | FFh | | | *** |

Table 3 below gives an explanation for symbols used in Tables 1 and 2, above.

TABLE 3

| Symbol | Meaning |
|---|---|
| * | Product dependent. Filled in by manufacturer to the JEDEC standard and write protected. |
| ** | Product dependent. Filled in by manufacturer. |
| *** | Initialized in by manufacturer or BIOS. |
| **** | Initialized by manufacturer or BIOS. Filled in by BIOS. |
| ***** | Filled in by manufacturer. |

As shown in Table 2, management data stored within the 128 bytes of EEPROMs 38 through 41 are used to store information identifying information about the DIMM. Bytes 0 through 21 gives information such as the manufacturer's name, product or accessory number, part number, Company Division, and Revision letters. The management data and the error log stays with the DIMM even when the DIMM is removed from one computing system and added to another computing system. The accessory number allows a service representative, without physically looking at the DIMM, to determine whether the DIMM was from a particular company. For example, this information is available by observing LEDs 51 through 54 or by accessing management information in the EEPROMs electronically.

For example, the EEPROMs are accessed electronically via I/O bus 17 using one of processors 11 or 12, or through an I/O card which is connected to I/O bus 17. For example, the I/O card is a Remote Assistant I/O card available from Hewlett-Packard Company. The EEPROMs are accessed via processor 11 or 12 using management software. For example, the management software is NetServer Assistant (NSA) management software available from Hewlett-Packard Company. Access to the EEPROMs through I/O bus 17 is through bridge 32, through system management controller 33 through management bus 46 and through memory management controller 31.

Bytes 28 through 30 contain the number of writes made to the EEPROM. Bytes 31 through 47 give additional information about the DIMM. For example, bytes 42 and 43 contain a two-byte time stamp which indicate the date the DIMM was turned on. Bytes 48 through 49 gives additional manufacturing data Bytes 126 and 127 is two unsigned bytes of data which are used to implement a Cyclic Redundancy Checksum (CRC) security system. The CRC is generated as a pseudo-random number using a linear feedback shift register (LFSR) implemented in firmware.

Figure 3:
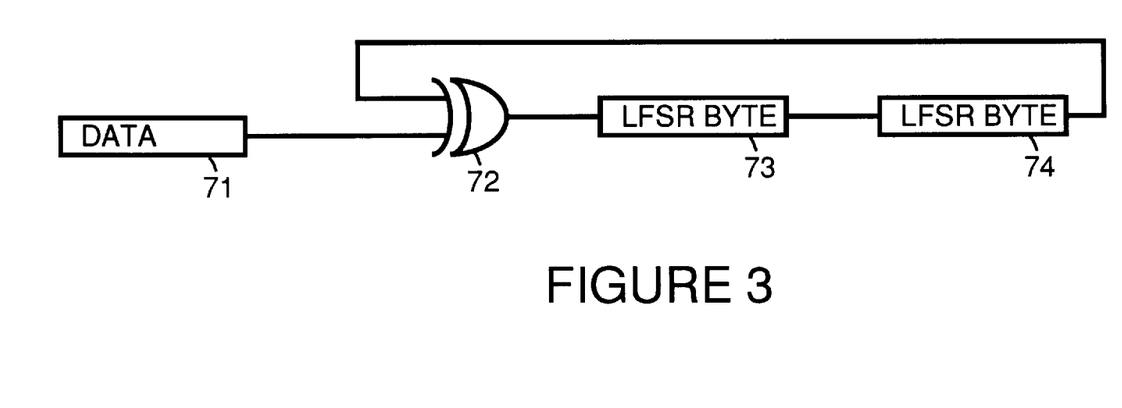
FIG. 3 illustrates the calculation of a value to be placed within a linear feedback shift register in accordance with a preferred embodiment of the present invention.

FIG. 3 is a schematic of an implementation of the system which generates the CRC. An LFSR includes an LFSR byte 73 and an LFSR byte 74. At the start of the sequence, the LFSR is initialized to a known value (usually non-zero). Data is read from the EEPROM a byte at a time and loaded into a data shift register 71. Data shift register 71 and the LFSR bytes 73 and 74 are then shifted 8 times. The bit shifted out of the most significant bit of data shift register 71 is XOR'd by XOR gate 72 with the bit shifted out of the most significant bit of LFSR byte 74. The result is shifted into the least significant bit of LFSR byte 73.

After all eight bits of data register have been shifted out, a new byte is read and the process repeated. After all of the bytes of data have been processed, the Cyclic Redundancy Checksum (CRC) is unloaded from the LFSR byte 73 and LFSR byte 74 and stored in bytes 126 and 127 of the EEPROM as shown in Table 2.

To verify data integrity in the EEPROM, the same process is used to generate a CRC which is then checked against the value stored in bytes 126 and 127. If they match then the data can be assumed to be correct.

Since this is a fairly simple algorithm, in the preferred embodiment, security has been added by two means. First, the value in LFSR byte 73 and LFSR byte 74 is initialized to one of $2^{16}$ possible values. Second, there is a string of bytes within the program area of the memory management controller 31 which are included into the CRC generation. Since the program area of the memory management controller 31 can be read protected, determining either of these values would either be impossible or too difficult to be worth doing by an unauthorized user.

Bytes 22 through 27, and 50 through 125, shown in Table 2, are used to perform error logging. In the preferred embodiment of the present invention, there are two types of errors logged: correctable errors and noncorrectable errors. Whenever I/O bridge and memory controller 14 detects an error, an interrupt to main processor 11 or 12 will be generated which will cause the system to log an error. A two byte timestamp consisting of the day, month, year, and 3 hour period of the day is generated by processor 11 or 12 executing firmware. The processor then sends an I²C message through baseboard interface 18 (shown in FIG. 2) to system management controller 33 which forwards the I²C message back through baseboard interface 18 to memory management controller 31. Memory management controller 31 logs the error message within the correct EEPROM.

Memory management controller 31 reads values stored in byte 22 or byte 25 (shown in Table 2) of the EEPROM on the DIMM to determine the location of the next available memory location in the EEPROM memory to save the error information. Two error logs are implemented as circular buffers. The correctable error log contains 32 (two byte) memory locations (bytes 54 through 117) and the non-correctable error log contains four memory locations (bytes 118 through 125). For the preferred embodiment the number of memory locations for each type of error were selected out of a compromise of space in the EEPROM and the relative frequency that the errors were expected. Each error log entry is a two-byte time stamp.

When either error log is full, the full error log will wrap to its beginning and start overwriting older entries. A count of how many times the buffer has wrapped is kept to allow calculation of how many errors were logged. For the correctable errors, this count is in byte 24 of Table 2. For the un-correctable errors, this count is in byte 27 of Table 2. Each wrap count is locked when it reaches 255.

Table 4 below is a code listing for firmware or software which generates time stamps for errors and performs CRC checking.

TABLE 4

```
;----------------------------------------------------------
; Routine to post a time stamp into the error log
; Format of data in the buffer:
; DBufO DBuf1 DBuf2 DBuf3 DBuf4
; <command> <log> <timestamp low byte> <timestamp high byte>
;<checksum>
; if <log> is zero then it is a non-correctable error timestamp.
; if <log> is non-zero then it is a correctable error timestamp.
; the format of the timestamp is:
;              low byte          high byte
; bits         7..4    3..0    7..3    2..0
; meaning      year    month   day     hour
; range        0-15    1-12    1-7     0-7
; the year is an offset from 1996, the month 1 =Jan, the day 1 = Sun,
; the hour is the 3 hour octant 0 = 0000 - 0259 (i.e. Midnight to 2:59 AM)
; The variable DimmNo must have first been set using a WriteDimm
; with a length of 0.
;
; NOTE: the CRC is updated after every log entry. This can take about
; 50 ms.
;------------------------------------------------------------------
LogTimestamp:
    setb WhichLog            ; set the WhichLog bit
    mov A, DBuf1             ; save the data so the buffer can be
    jnz LogOK
    clr WhichLog             ; if A was 0 then clear WhichLog
LogOK:
```

TABLE 4-continued

```
        mov TimeStampLo, DBuf2      ; used to read the DiMM
        mov TimeStampHi, DBuf3
        mov NVAddr, #HPLogPointers  ; start of Log Pointers in Private area
        acall DoDimmRead            ; and read 8 bytes into the buffer
; the buffer now contains
        ; DBuf1 Offset of next correctable log entry
        ; DBuf2 Offset of correctable error table
        ; DBuf3 Count of wraps of correctable error table
        ; DBuf4 Offset of next non-correctable log entry
        ; DBuf5 Offset of non-correctable error table
        ; DBuf6 Count of wraps of non-correctable error table
        ; now check which log it is to be written to
        jnb WhichLog, NonCorrectable ; if zero then non-correctable
; correctable error gets logged
        mov BufPtr, #DBuf1          ; point R0 at the correctable table
        ajmp UpdateTable
NonCorrectable:
        mov BufPtr, #DBuf4          ; point R0 at the non-correctable table
UpdateTable:
        mov Offset, @R1             ; get the offset of the next timestamp
        inc @R1                     ; bump the offset to the next location
        inc R1
        inc R1                      ; bump R0 the table start offset (DBuf2 or 5)
        mov A, @R1                  ; load A with the offset of the start of the table
        add A, #7                   ; length of non-correctable table - 1
        jnb Whichlog, Cont          ; if correctable then add more
        add A, #56                  ; length of correctable - 8 -1
                                    ; this will always clear the carry
Cont:
        subb A, Offset              ; subtract the new offset from A
        jnc OffsetOK                ; if new offset not past end of table then OK
        mov Offset, @R1             ; wrap around to start of table (DBuf2 or 5)
        inc R1                      ; bump R0 to wrap count (DBuf3 or 6)
        inc @R1                     ; increment the wrap count
OffsetOK:
        ;now rewrite all six bytes including the three bytes that changed
        mov ByteCnt, #6
        mov BufPtr, #DBuf1
        mov NVAddr, #HPLogPointers  ; start of correctable error log pointers
        acall DoDimmWrite           ; and write 6 bytes back out
        jc 12C_Failure              ; if return w/c=1 then no i2c ack
; now the time stamp data must be written out
        mov NVAddr, Offset          ; the offset back into NVAddr
        mov BufPtr, #TimeStampLo
        mov ByteCnt, #2
        acall DoDimmWrite           ; and write the two bytes back out
        jc 12C_Failure              ; if return w/c=1 then no i2c ack
        ;just drop through to WriteCRC and save two bytes
        ajmp WriteCRC               ; update the CRC and return from there
;-----------------------------------------------
; this routine will call CalculateCRC to get the crc of the first 126 bytes
; of the HP Private area and then write them into the last 2 bytes of the
; DIMM EEPROM.
;---------------------------------------------------------
WriteCRC:
        acall CalculateCRC
        jc 12C_Failure              ; if return w/c=1 then no i2c ack
        acall DoWriteCRC
        jc 12C_Failure              ; if return w/c=1 then no i2c ack
        ajmp WriteExit
DoWriteCRC:
        mov BufPtr, #DBuf3
        mov @R0, HighByte
        dec R0 ; point to DBuf2
        mov @R0, lowByte
        dec R0 ; point to DBUF1
        mov @R0, #254 ; offset of CRC
        mov ByteCnt, #3
        acall DoDimmWrite
        jc 12C_Failure
        ret
12C_Failure:
        mov SuccessCode, #IS_FAILNO12CACK
        ret
; -------------------------------------
; this routine will calculate a pseudorandom number based
; on the contents of the first 126 bytes of the HP Private
; area of the DIMM EEPROM. The variable DimmNo must
; have first been set using a WriteEeprom command
```

TABLE 4-continued

```
; with a length of 0.
;
; uses      BufPtr (R0)
;           ByteCnt (R3)
; ------------------------------------------
CalculateCRC:
    ; initialize the shift register
    mov LowByte, #InitLowByte
    mov HighByte, #InitHighByte
    mov BufPtr, #DBuf1          ; move the "magic string" into the buffer
    mov DPTR, #MagicString
    mov ByteCnt, #10
MagicStringLoop:
    clr A ; clear A for indexing movc A, @A+DPTR; get a character
    mov @R0, A                  ; put it into the buffer
    inc R0                      ; bump the pointers
    inc DPTR
    djnz ByteCnt, MagicStringLoop
    mov ByteCnt, #10            ; number of bytes in the magic string
    mov BufPtr, #DBuf1          ; point to first byte of the magic string
    acall ByteLoop              ; and start the CRC
    mov CRCCnt, #15             ; number of 8 byte loads
    mov NVAddr, #128            ; start of HP Private area
ReadLoop:
    acall DoDimmRead            ; read from the proper DIMM
    jc CalculateCRCexit
    mov A, NVAddr               ; bump for the next read
    add A, #8
    mov NVAddr, A
    mov ByteCnt, #8             ; number of bytes per load of the buffer
    mov BufPtr, #DBuf1          ; point to first byte of the load
    acall ByteLoop
    djnz CRCCnt, ReadLoop
    acall DoDimmRead            ; read from the proper DIMM
    jc CalculateCRCexit
    mov ByteCnt, #6             ; number of bytes per last load of the buffer
    mov BufPtr, #DBuf1          ; point to first byte of the load
                                ; and fall through
ByteLoop:
    mov BitCnt, #8              ; number of bits per byte
    mov A, @R0                  ; get a byte into A
    inc R0                      ; bump the pointer for next time
BitLoop:
    rlc A                       ; shift a bit of A into the carry
    jb FeedBack, FB1            ; jump if the feedback bit is a one
    jc Set1                     ; FB(0) xor C(1) = 1
    jnc Set0                    ; FB(0) xor (0) = 0
FB1:
    jc Set0                     ; FB(1)xorC(1) = 0
Set1:
    setb C                      ; force the C to 1
    ajmp Shift
Set0:
    clr C                       ; force the C to 0
Shift:
    push Acc                    ; save A past the shift
    mov A, LowByte              ; now shift it into the CRC
    rlc A
    mov LowByte, A
    mov A, HighByte
    rlc A
    mov HighByte, A
    pop Acc                     ; and restore A
    djnz BitCnt, BitLoop
    djnz ByteCnt, ByteLoop
    clr C                       ; exit with c=0 if no errors
CalculateCRCexit:
    ret
; -----------------------------------------------------------------
; this routine will call CalculateCRC to get the crc of the first 126
; bytes of the HP Private area and then compare that with the
; last two bytes in the DIMM EEPROM and make sure they match.
; -------------------------------------------
VerifyCRC:
    acall CalculateCRC
    jc NoCompare                ; if return w/c=1 then no i2c ack
    mov A, @R0                  ; pick up the low byte of the CRC in memory
    cjne A, LowByte, NoCompare  ; if not equal then error
    inc R0
```

TABLE 4-continued

```
    mov  A, @R0          ; pick up the high byte of the CRC in memory
    cjne A, HighByte, NoCompare    ; if not equal then error
    mov  DBufO, #IS_SUCCESS
    mov  R2, #1
    ajmp SetReadChecksum
NoCompare:
    mov  DBufO, #IS_FAILCRC
    mov  R2, #1
    ajmp SetReadChecksum
```

The foregoing discussion discloses and describes merely exemplary methods and embodiments of the present invention. As will be understood by those familiar with the art, the invention may be embodied in other specific forms without departing from the spirit or essential characteristics thereof. Accordingly, the disclosure of the present invention is intended to be illustrative, but not limiting, of the scope of the invention, which is set forth in the following claims.

We Claim:

1. A method for managing a memory module comprising:
   (a) within the memory module providing a management memory which provides permanent storage for management information; and,
   (b) storing within the management memory, an error log which indicates a time stamp for errors which occur in normal operation of the memory module.

2. A method as in claim 1 wherein step (b) includes the following substeps:
   (b.1) storing within the management memory, a first list which indicates a time stamp for each correctable error which occurs in operation of the memory module; and,
   (b.2) storing within the management memory, a second list which indicates a time stamp for each non-correctable error which occurs in operation of the memory module.

3. A method as in claim 2:
   wherein substep (b.1) includes the following substeps,
     (b.1.1) when the first list is full, wrapping the first list by overwriting entries in the first list when new correctable errors occur in operation of the memory module, and
     (b.1.2) storing in the management memory a first wrap count which indicates a number of times the first list wraps around; and,
   wherein substep (b.2) includes the following substeps,
     (b.2.1) when the second list is full, wrapping the second list by overwriting entries in the second list when new non-correctable errors occur in operation of the memory module, and
     (b.2.2) storing in the management memory a second wrap count which indicates a number of times the second list wraps around.

4. A method as in claim 3:
   wherein in substep (b.1.2) when the first wrap count reaches a first maximum value, the first wrap count is frozen at the first maximum value; and
   wherein in substep (b.1.2) when the second wrap count reaches a second maximum value, the second wrap count is frozen at the second maximum value.

5. A method as in claim 1 additionally comprising the following step:
   (c) storing within the management memory, a time stamp which indicates when the memory module was first placed in service.

6. A method as in claim 1 additionally comprising the following step:
   (c) storing within the management memory, a cyclic redundancy checksum, as a security check for information stored in the management memory.

7. A method as in claim 6 wherein in step (c) the cyclic redundancy checksum is calculated using a string of bytes within a program area of a microprocessor which accesses the management memory.

8. A method for managing a memory module comprising:
   (a) within the memory module providing a management memory which provides permanent storage for management information; and,
   (b) storing within the management memory, cyclic redundancy checksum, as a security check for information stored in the management memory wherein the cyclic redundancy checksum is calculated using a string of bytes within a program area of a microprocessor which accesses the management memory.

9. A method for managing a memory module comprising:
   (a) within the memory module providing a management memory which provides permanent storage for management information; and,
   (b) storing within the management memory, data about the history of the memory module, including a time stamp which indicates when the memory module was first placed in service.

10. A memory module comprising:
    data storage area for storing data; and,
    a management memory which provides a means for permanently storing management information about the memory module, the management memory including a means for storing an error log which indicates a time stamp for errors which occur in normal operation of the memory module.

11. A memory module as in claim 10 wherein the error log includes:
    a first list which indicates a time stamp for each correctable error which occurs in operation of the memory module; and,
    a second list which indicates a time stamp for each non-correctable error which occurs in operation of the memory module.

12. A memory module as in claim 11 wherein the error log additionally; includes:
    a first wrap count which indicates a number of times the first list wraps around; and,
    a second wrap count which indicates a number of times the second list wraps around.

13. A memory module as in claim 10 wherein the management memory additionally includes a time stamp which indicates when the memory module was first placed in service.

14. A memory module as in claim 10 wherein the management memory additionally includes a cyclic redundancy checksum, as a security check for information stored in the management memory.

15. A memory module as in claim 14 wherein the cyclic redundancy checksum is calculated using a string of bytes within a program area of a microprocessor which accesses the management memory.

16. A management system within a computing system for managing a memory module comprising:
   a management memory within the memory module, the management memory providing permanent storage for management information;
   an indicating light, dedicated to indicating information about the memory module; and,
   a management controller, coupled to the management memory and the indicating light, for accessing the management information within the management memory and causing the indicating light to indicate information about the memory module, wherein the management controller indicates information about the memory module by controlling when the indicating light is turned on and when the indicating light is turned off.

17. A management system as in claim 16 wherein:
   when the indicating light is off, this indicates the memory module is not within a memory module slot;
   when the indicating light flashes at a first rate, this indicates that the memory module is not operating properly within the computing system;
   when the indicating light blinks at a second rate, this indicates that the memory module is not from a particular entity; and,
   when the indicating light is on steadily, this indicates that the memory module is from the particular entity and operating properly.

18. A management system as in claim 16 wherein the management system manages additional memory modules and includes additional indicating lights.

19. A management system as in claim 18 wherein the indicating lights are additionally used to indicate status of a central processing unit for the computing system.

* * * * *